United States Patent
Chen

(10) Patent No.: US 6,817,533 B2
(45) Date of Patent: Nov. 16, 2004

(54) DIGITAL CARD-STRUCTURE

(75) Inventor: Chien-Yuan Chen, 5F-1, No. 8, Sec. 3, Shuangsh Rd., Banchiau City, Taipei (TW)

(73) Assignees: Power Digital Card Co., Ltd., Taipei (TW); Chien-Yuan Chen, Taipei (TW)

( * ) Notice: Subject to any disclaimer, the term of this patent is extended or adjusted under 35 U.S.C. 154(b) by 0 days.

(21) Appl. No.: 10/385,738

(22) Filed: Mar. 12, 2003

(65) Prior Publication Data

US 2004/0178275 A1 Sep. 16, 2004

(30) Foreign Application Priority Data

Jan. 15, 2003 (TW) .................................. 92200704 U

(51) Int. Cl.[7] .............................................. G08K 19/06
(52) U.S. Cl. ...................... 235/492; 235/486; 235/441
(58) Field of Search ................................ 235/492, 486, 235/487, 441; 439/188

(56) References Cited

U.S. PATENT DOCUMENTS

| | | | | |
|---|---|---|---|---|
| 4,565,922 A | * | 1/1986 | Anderson | 235/492 |
| 4,737,602 A | * | 4/1988 | Yamamoto | 200/16 D |
| 4,774,399 A | * | 9/1988 | Fujita et al. | 235/441 |
| 6,386,459 B1 | * | 5/2002 | Patrice et al. | 235/492 |
| 6,399,906 B1 | * | 6/2002 | Sato et al. | 200/61.59 |
| 6,616,053 B2 | * | 9/2003 | Kondo et al. | 235/492 |

* cited by examiner

Primary Examiner—Michael G. Lee
Assistant Examiner—Seung H Lee
(74) Attorney, Agent, or Firm—Troxell Law Office PLLC

(57) ABSTRACT

The present invention provides a structure for digital cards, which includes a digital card main body, with the following features: contacts are attached to both sides; it furthermore possesses an electronic write-protection; wherein the contacts on both sides are used to raise the transfer efficiency, while the write-protection provides for a more secure possibility to define the card as write protected or write enabled.

8 Claims, 5 Drawing Sheets

DIGITAL CARD-STRUCTURE

BACKGROUND OF THE INVENTION

1) Field of the Invention

The present invention provides a new structure for digital cards, which are equipped with double-sided contacts and an electronic write-protection.

2) Description of the Prior Art

Digital cards, also known as smart cards or memory cards, form the newest generation of data storage media. Their features include their small size, a high storage volume and a fast transfer speed. These cards are therefore the ideal choice as storage and transport media for multimedia data.

For the structure of conventional digital cards, please refer to FIG. 1 and FIG. 1A. The digital card 10 comprises a main body 11, with said main body 11 equipped with a number of contacts attached to one side. To prevent the digital card 10 from overwriting data by mistake, the main body possesses a write-protection switch 20 made of plastic. This write-protection switch 20 uses a card hook 21 to hook up to an edge formed in an grove 13 of the main body 11. The write-protection switch 20 can be moved on an elevation 15 inside of the grove 13. The write protected or write enabled state of the digital card 10 is determined by the position of the write-protection switch 20.

Conventional digital cards have two weaknesses:

The contacts 12 are only attached to one side, therefore the amount of data which can be transferred is restricted, and the digital card is unable to use its full potential.

The write-protection switch 20 is made of plastic and will lose quality after long use, resulting in malfunctions of the card.

SUMMARY OF THE INVENTION

The aim of the present invention is to provide a structure for digital cards, which comprises a main body, to which contacts are attached on both sides, and which furthermore possesses an electronic write-protection, wherein the contacts on both sides are used to raise the transfer efficiency, while the write-protection provides for a more secure possibility to define the card as write protected or write enabled.

DETAILED DESCRIPTION OF THE PREFERRED EMBODIMENT

The present invention is now described in further detail through use of the attached pictures and examples of ideal structures.

Figure 1:
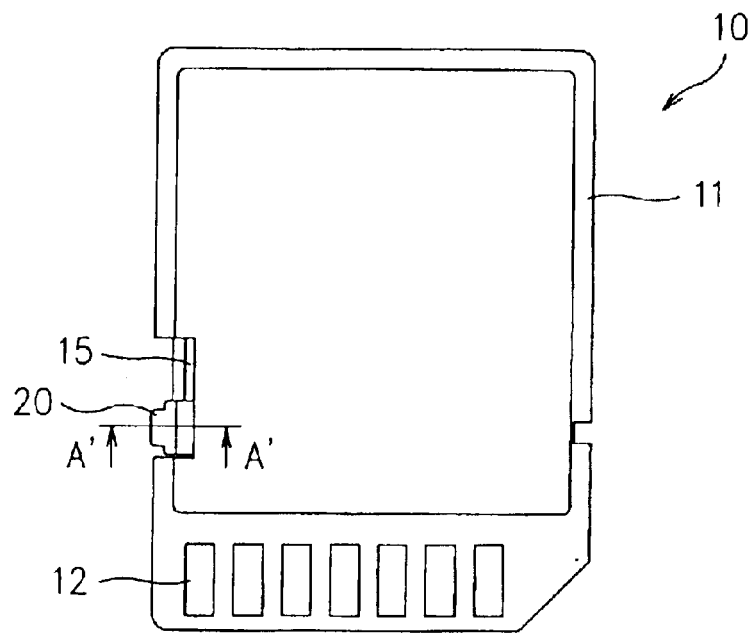
FIG. 1 shows a full display of a conventional digital card.
Figure 1A:
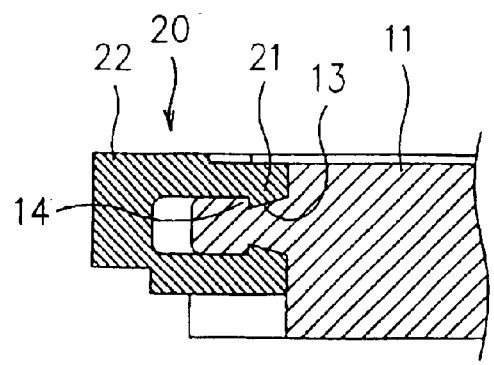
FIG. 1A shows a display of the part labeled A—A in FIG. 1.
Figure 2B:
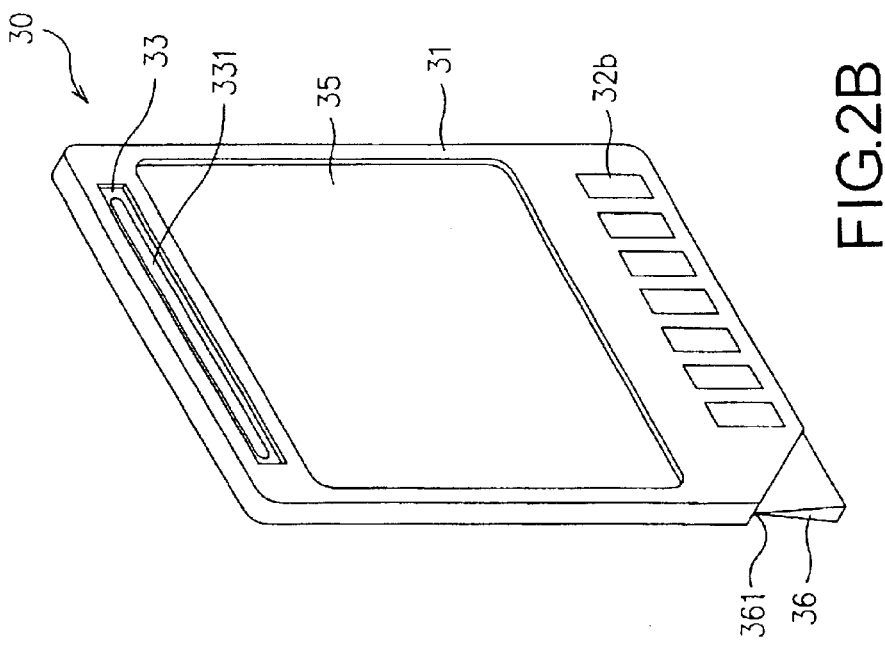
FIGS. 2A and 2B show three-dimensional displays of both sides of one practical example for the present invention.
Figure 2A:
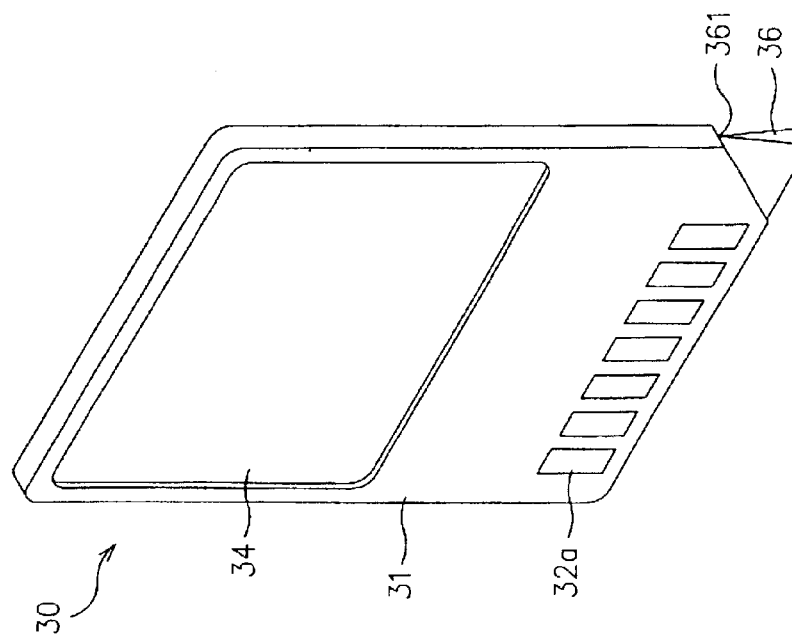

On FIG. 2A and FIG. 2B there is a practical example shown for the is structure of a digital card described by the present invention. The digital card 30 comprises a main body 31, said main body 31 has got contacts 32a, 32b on the rear and front sides. These contacts 32a, 32b are connected to the electronic circuit inside of the main body 31. The contacts 32a, 32b can also be attached in an order which places the upper and lower contacts in different positions, to let the contacts 32a, 32b cover a transfer area on the digital card 30 as wide as possible and thus having the effect of raising the transfer speed of the digital card 30.

The main body 31 has furthermore got two deepenings 34, 35 on the front and back side, which can be used for labels or product information. On the upper edge of the main body 31, there is a grove 33, inside of which there is an edge 331. Said grove 33 and said edge 331 can be used to get a better grip on the digital card 30. Furthermore the main body 31 possesses a foldable edge 36, which is located on one of the lower edges of the main body 31, and which is connected to the main body 31 through a connecting piece 361, which stands of from the main body 31 in an angle of 45°. After leaving the factory, the foldable edge 36 is connected with the main body 31 of the digital card 30. The digital card 30 therefore takes on the shape of an rectangle, and can be used by card drives made for rectangle cards. If the foldable edge 36 is separated from the connecting part 361, the digital card 30 can be read by conventional card drives.

Figure 3B:
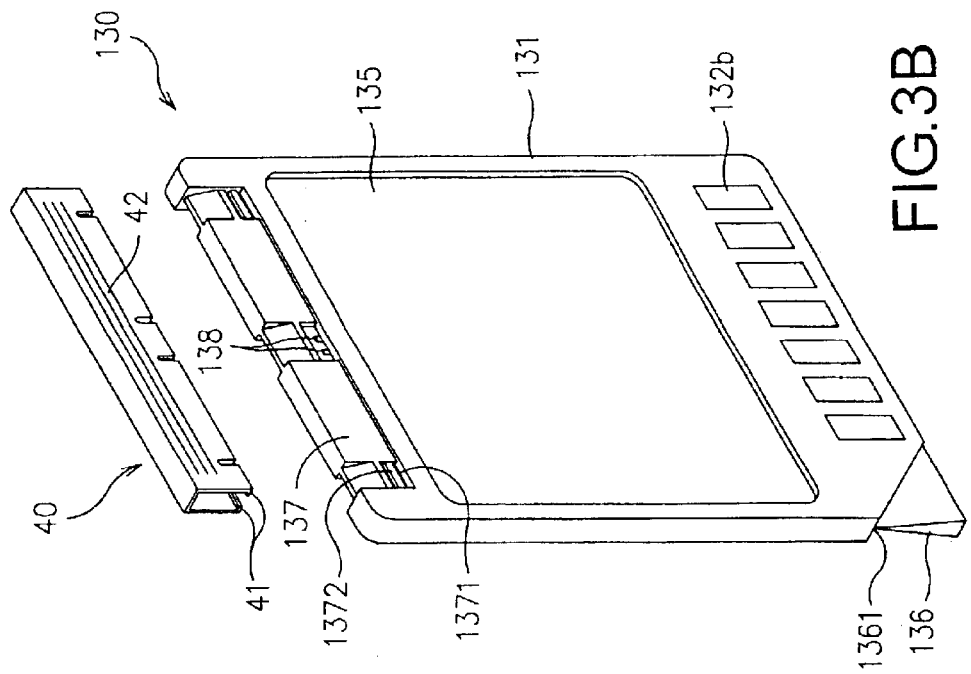
FIG. 3B shows a three-dimensional display for the parts on the back side of the practical example shown in FIG. 3A.
Figure 3A:
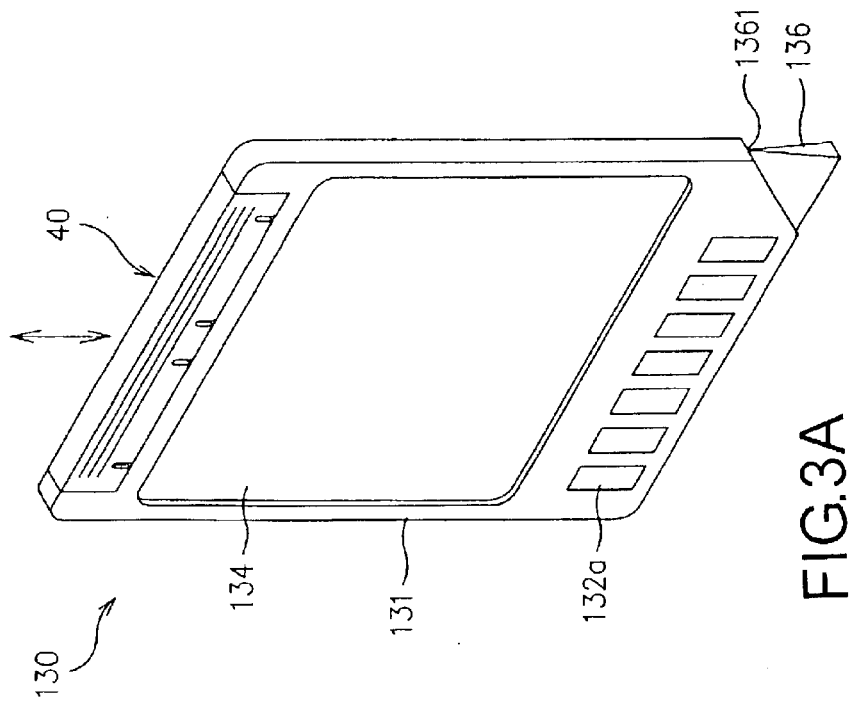
FIG. 3A shows another three-dimensional display of one practical example for the present invention.

Please refer to FIG. 3A and FIG. 3B. These show another practical example for the structure of a digital card described by the present invention. The digital card 130 comprises a main body 131, said main body 131 has got contacts 132a, 132b on the rear and front sides. These contacts 132a, 132b are connected to the electronic circuit inside of the main body 131. The contacts 132a, 132b can also be attached in an order which places the upper and lower contacts in different positions, to let the contacts 132a, 132b cover a transfer area on the digital card 130 as wide as possible and thus having the effect of raising the transfer speed of the digital card 130.

The main body 131 has furthermore got two deepenings 134, 135 on the front and back side, which can be used for labels or product information. Furthermore the main body 131 possesses a foldable edge 136, which is located on one of the lower edges of the main body 131, and which is connected to the main body 131 through a connecting piece 1361, which stands of from the main body 131 in an angle of 45°. After leaving the factory, the foldable edge 136 is connected with the main body 131 of the digital card 130. The digital card 130 therefore takes on the shape of an rectangle, and can be used by card drives made for rectangle cards. If is the foldable edge 136 is separated from the connecting part 1361, the digital card 130 can be read by conventional card drives.

Please refer to FIG. 3B. On this picture, there is the main body 131 shown, with the electronic write-protection 40 installed on the upper edge. The electronic write-protection 40 is formed of a metallic cover. Inside of the write protection 40, there are card hooks 41, which grip into the grove 137 on the upper edge of the main body 131. This grove 137 possesses deepenings 1371, which are opposite to the card hooks 41 and which can take in these card hooks 41.

Figure 4:
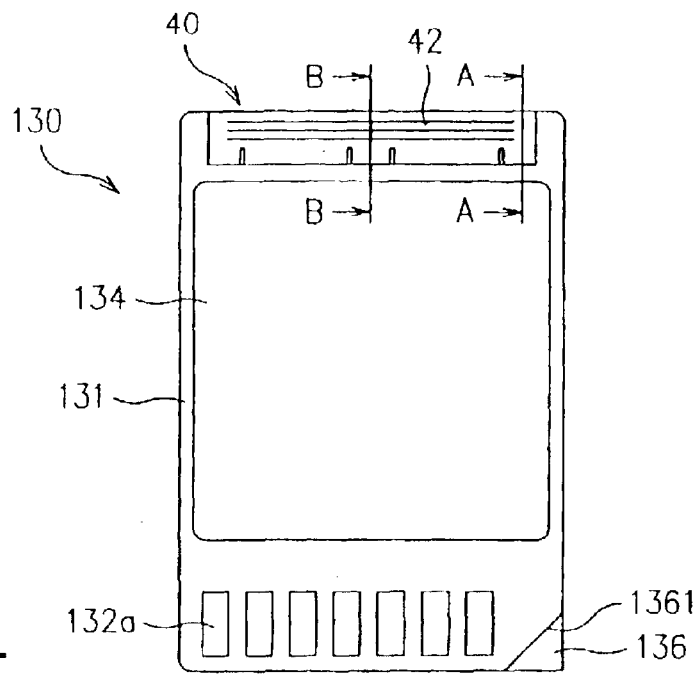
FIG. 4 shows a full display of the practical example shown in FIG. 3.
Figure 4A:
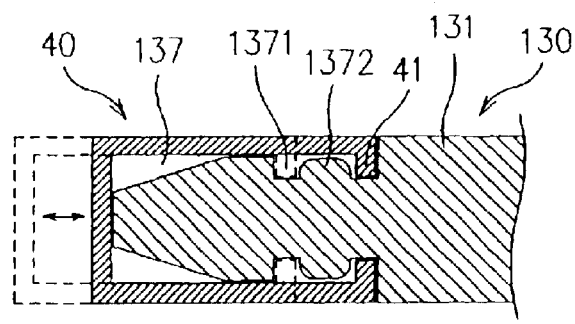
FIG. 4A shows a display of the part labeled A—A in FIG. 4.
Figure 4B:
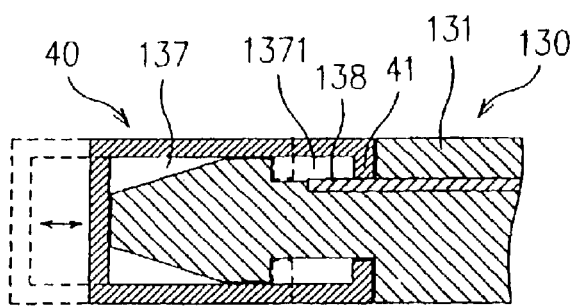
FIG. 4B shows a display of the part labeled B—B in FIG. 4.

After the write protection 40 is placed onto the grove 137, the card hooks 41 grip into the deepenings 1371, as shown on FIG. 4A. The card hooks 41 can be moved inside of the deepenings 1371 to bring the write protection 40 closer to the main body 131 or farther away from it. Thus the position of the write protection 40 is altered. Inside of the deepenings 1371 there is a heightening 1372, which is used to fix the card hooks 41 after the movement of the write protection 40 and which prevent the write protection 40 from changing its position. Furthermore, there are power connectors 138 fixed inside of the grove 1371. After the connection of the power connectors 138 with the write protection 40, the power circuit is broken and the digital card 130 is write-protected. If the power connectors 138 and the write protection 40 are separated again, the power is circuit is once again closed, therefore the digital card 130 is rendered write-enabled (Please refer to FIG. 4B). Furthermore, the surface of the write protection 40 can be covered by a rough structure 42, like the structure shown on the picture, which consists of several rows of parallel ridges. This structure helps the user to move the write protection 40.

Figure 5B:
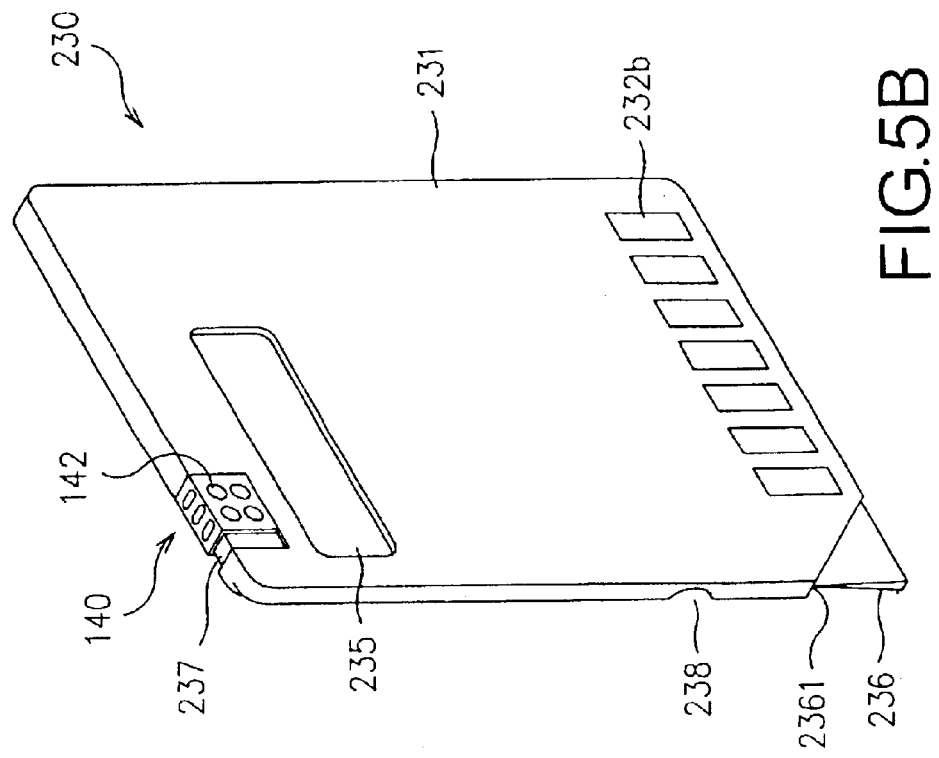
FIG. 5A and FIG. 5B show three-dimensional displays of both sides of another practical example for the present invention.
Figure 5A:
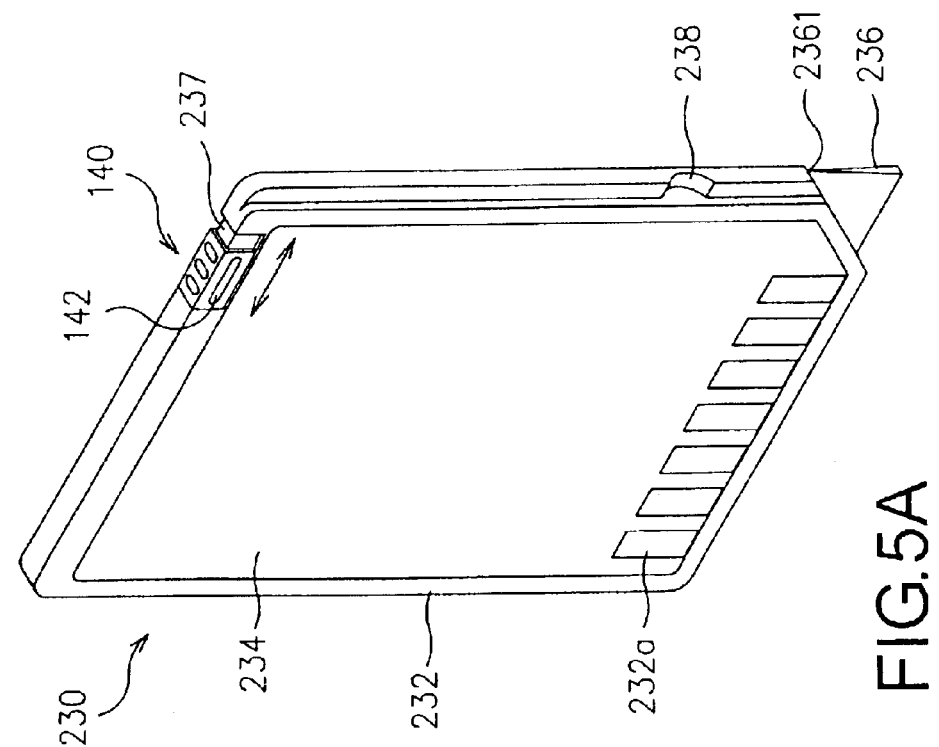

Please refer now to FIG. 5A and FIG. 5B. These show another practical example for the electronic write-protection 140 installed on the upper edge of the digital card 230. The digital card 230 comprises a main body 231, said main body 231 has got contacts 232a, 232b on the rear and front sides. These contacts 232a, 232b are connected to the electronic circuit inside of the main body 231. The contacts 232a, 232b can also be attached in an order which places the upper and lower contacts in different positions, to let the contacts 232a, 232b cover a transfer area on the digital card 230 as wide as possible and thus having the effect of raising the transfer speed of the digital card 230.

The main body 231 has furthermore got two deepenings 234, 235 on the front and back side, which can be used for labels or product information. Furthermore the main body 231 possesses a foldable edge 236, which is located on one of the lower edges of the main body 231, and which is connected to the main body 231 through a connecting piece 2361, which stands of from the main body 231 in an angle of 45°. After leaving the factory, the foldable edge 236 is connected with the main body 231 of the digital card 230. The digital card 230 therefore takes on the shape of an rectangle, and can be used by card drives made for rectangle cards. If the foldable edge 236 is separated from the connecting part 2361, the digital card 230 can be read by conventional card drives.

The electronic write-protection 140 is formed of a metallic cover. This electronic write-protection 140 can be moved inside of the grove 237. Through change of the position of the write-protection 140, the electronic circuit is closed or open, which renders the digital card 230 write enabled or write protected. This function is similar to the one described in FIG. 4B. The surface of the write protection 140 can be covered by a rough structure 142, which helps the user to move the write protection 140. Furthermore, the main body 231 possesses a deepening 238, which is used to help the card ejection of the card drive. This function prevents the card from being ejected to fast, thus also presenting a slight improvement to the design of prior inventions.

The present invention provides a structure for digital cards, which includes contacts attached to both sides of the structure, and which furthermore possesses an electronic write-protection, wherein the contacts on both sides are used to raise the transfer efficiency, while the write-protection provides for a more secure possibility to define the card as write protected or write enabled. In summation of the foregoing section, while the invention herein has been particularly shown and described with reference to preferred embodiments thereof, it will be understood by those skilled in the art that various other changes in form and detail may be made without departing from the spirit and scope of the invention herein.

What is claimed is:

1. A digital card with an internal electronic circuit comprising:
 a) a main body having:
  i) a plurality of first and second contacts electrically connected to the electronic circuit, the plurality of first contacts are located on a front of the main body, the plurality of second contacts are located on a rear of the main body;
  ii) a write-protection groove located on the front and the rear of the main body;
  iii) a plurality of write-protection contacts located in at least one write-protection groove and electrically connected with the electronic circuit;
  iv) a metallic electronic write-protection cap selectively engaging the plurality of write-protection contacts and having card hooks extending into each write-protection groove, the electronic write-protection cap being movable between open and closed positions, such that, in the open position the digital card is write-protected and in the closed position the digital card is write-enabled; and
  v) a foldable edge removably connected to the main body by a connecting part, such that when the foldable edge is removed the digital card is readable in a card reader.

2. The digital card according to claim 1, wherein the main body includes two recessed portions, one recessed portion being located on each of the front and the rear of the main body.

3. The digital card according to claim 1, wherein the electronic write-protection cap is removably connected to the main body.

4. The digital card according to claim 1, wherein the electronic write-protection cap is slidable within each write-protection groove.

5. The digital card according to claim 1, further comprising a heightening protrusion located in each write-protection groove and securing the electronic write-protection cap in a selected position.

6. The digital card according to claim 1, wherein the main body has an ejection groove for controlling an election speed of the digital card.

7. The digital card according to claim 1, wherein the connecting part is located at a 45 degree angle across a corner of the main body.

8. The digital card according to claim 1, wherein the main body includes a gripping groove with an edge on an interior thereof.

* * * * *